Feb. 11, 1969 J. R. TEMPLIN 3,427,477

ELECTRONIC DIRECT CURRENT SWITCHING CIRCUIT

Filed Aug. 12, 1965

INVENTOR.
Jackson R. Templin
BY Richard G. Stahr
ATTORNEY

United States Patent Office 3,427,477

Patented Feb. 11, 1969

3,427,477

ELECTRONIC DIRECT CURRENT SWITCHING CIRCUIT

Jackson R. Templin, Anderson, Ind., assignor to General Motors Corporation, Detroit, Mich., a corporation of Delaware Filed Aug. 12, 1965, Ser. No. 479,261
U.S. Cl. 307—252 5 Claims
Int. Cl. H03k *17/00, 19/08*

ABSTRACT OF THE DISCLOSURE

An electronic direct current switching circuit for switching direct current circuits with a silicon controlled rectifier. The anode-cathode electrodes of a silicon controlled rectifier and at least a portion of an inductance element are connected in series between the positive polarity terminal of a direct current potential source and one side of an electrical load with the other side of the electrical load connected to the negative polarity terminal of the potential source. A controllable switching device is connected in series with at least at portion of the inductance element across the direct current potential source and a capacitor is connected across the potential source between the silicon controlled rectifier switching device and the electrical load.

Figures 1, 2:
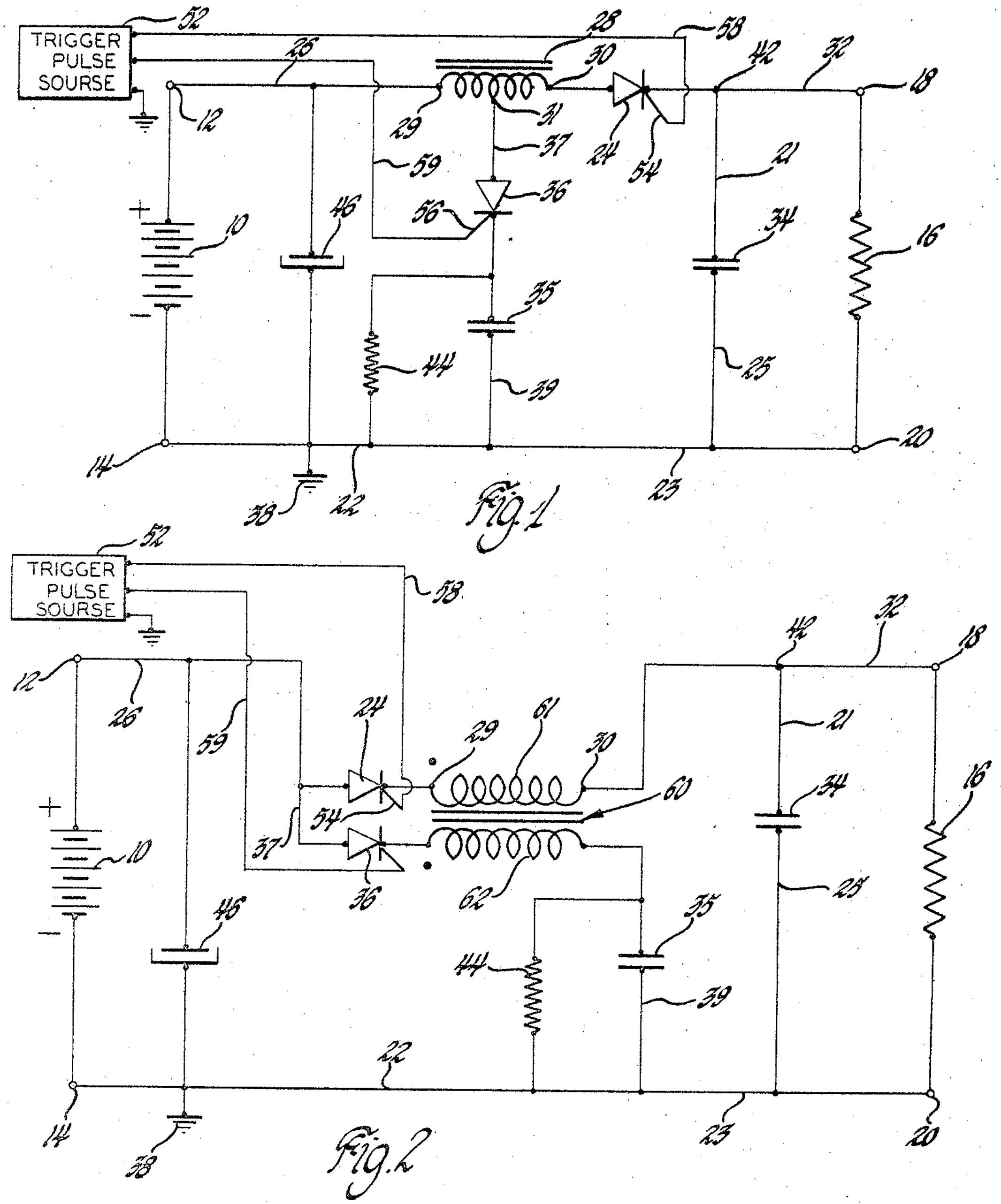

This invention relates to direct current switching circuits and, more specifically, to electronic direct current switching circuits employing a silicon controlled rectifier as the switching element.

Since the development of the silicon controlled rectifier device, it has become widely accepted as an electrical circuit switching element in that it eliminates the disadvantages of the movable contacts of mechanical switching devices formerly used.

Silicon controlled rectifiers, when forward poled, may be selectively triggered to conduction upon the application to the control electrode of a potential of a polarity which is more positive than that present upon its cathode and of a magnitude greater than the minimum firing potential level of the device. When triggered to conduction, however, these devices may no longer be controlled by the gate or control electrode and, therefore, continue conduction until the energizing circuit is interrupted or the anode-cathode polarities reversed.

Because of these characteristics, these devices have been readily adaptable to switch alternating current circuits in that they are automatically extinguished at the beginning of each half cycle during which the anode-cathode circuit is reverse biased.

With direct current applications, however, the application of these devices is more difficult as the anode-cathode polarity does not automatically reverse. Therefore, it is necessary to provide auxiliary extinguishing arrangements so that these devices may be selectively extinguished to interrupt the energizing circuit.

As silicon controlled rectifiers provide many advantages over mechanical switches for any switching application, the requirement of a reliable and inexpensive electronic direct current switching circuit using silicon controlled rectifiers as the switching element is apparent.

It is, therefore, an object of this invention to provide an improved direct current switching circuit.

It is another object of this invention to provide an improved electronic direct current switching circuit.

It is another object of this invention to provide an improved electronic direct current switching circuit employing silicon controlled rectifier devices as the switching element.

In accordance with the invention, an electronic direct current switching circuit is provided wherein a selectively operable silicon controlled rectifier switching device is employed in conjunction with a selectively operable extinguishing circuit which produces and applies the proper polarity potentials to reverse bias the silicon controlled rectifier switching element when it is desired to interrupt the energizing circuit.

For a better understanding of the present invention, together with additional objects, advantages and features thereof, reference is made to the following description and accompanying drawing in which:

FIGURE 1 is one emobdiment of the electronic direct current switching circuit of this invention in schematic form and, FIGURE 2 is an alternate embodiment of the electronic direct current switching circuit of this invention in schematic form.

Referring to FIGURE 1, a direct current potential source, herein shown as a battery 10, having positive and negative polarity terminals, as indicated, is electrically interconnected with an electrical load, herein illustrated as a fixed resistor 16. It is to be specifically understood that this invention is not to be limited to a battery direct current potential source or a resistive load as this device may be employed with other types of potential sources and electrical loads.

A selectively operable silicon controlled rectifier switching device 24 for establishing and interrupting the electrical circuit between the potential source 10 and electrical load 16 is connected in series with the power source 10 and the electrical load 16 and forward poled.

To extinguish a conducting silicon controlled rectifier device, the energizing circuit must be interrupted or the anode-cathode potential polarities reversed for a time period equal to or greater than the turn-off time of the device. Of these two alternatives, the reversal of the anode-cathode potential polarities is perhaps the more satisfactory.

A selectively operable extinguishing circuit arrangement for producing and applying reverse polarity potentials across silicon controlled rectifier switching device 24 is provided. This extinguishing circuit arrangement is comprised of an inducing element which produces and applies the reverse polarity potentials across switching device 24 and a controllable switching device for energizing the inductance element when it is desired to extinguish switching device 24.

In FIGURE 1, this inductance element has been shown as an inductor device 28 having two end terminals and an intermediate terminal and in FIGURE 2 as a transformer 60 having a primary winding 61 and a secondary winding 62.

So that the inductance element may be selectively energized and the reverse potentials thereby produced may be applied across silicon controlled rectifier switching device 24, at least a portion thereof must be connected in series with the controllable switching device, herein shown as silicon controlled rectifier 36, and at least a portion thereof must be connected in series with silicon controlled rectifier 24.

In FIGURE 1, that portion of the inductance element connected in series with the controllable switching device 36 is that portion of inductor 28 between intermediate terminal 31 and end terminal 29 and that portion of the inductance element connected in series with silicon controlled rectifier 24 is that portion of inductor 28 between end terminals 29 and 30. In FIGURE 2, that portion of the inductance element connected in series with the controllable switching device 36 is winding 62 of transformer 60 and that portion of the inductance element connected in series with silicon controlled rectifier 24 is winding 61 of transformer 60.

Silicon controlled rectifier switching device 24 and the end terminals 29 and 30 of inductor device 28 of FIGURE 1 are connected in series with each other and in series between one terminal of potential source 10 and electrical load 16 in one branch of the electrical circuit interconnecting potential source 10 and electrical load 16.

This branch of the electrical circuit interconnecting potential source 10 and electrical load 16 may be traced from the positive polarity terminals of potential source 10, through input terminal 12, line 26, inductor device 28, silicon controlled rectifier device 24, line 32 and output terminal 18 to one side of electrical load 16. The other branch of this circuit may be traced from the opposite terminal of potential source 10, through input terminal 14, line 22, line 23 and output terminal 20 to the other side of electrical load 16. This branch may be grounded as shown at 38.

As the anode electrode of silicon controlled rectifier device 24 is connected to the positive polarity terminal of potential source 10 through inductor 28, line 26 and input terminal 12 and the cathode electrode is connected to the opposite or negative polarity terminal of potential source 10 through line 32, output terminal 18, electrical load 16, output terminal 20, line 23, line 22 and input terminal 14, this device is forward poled and may be triggered to conduction upon the application of a potential pulse of a polarity which is positive in respect to the cathode to the control electrode 54 thereof.

Capacitor 34 is connected to the cathode of silicon controlled rectifier switching device 24 and the terminal of potential source 10 opposite the terminal to which the anode of the silicon controlled rectifier device 24 is connected through a circuit which may be traced from the cathode of device 24, junction 42, through line 21, capacitor 34, line 25, line 23, line 22 and input terminal 14.

Silicon controlled rectifier device 36 and capacitor 35 are connected in series between the intermediate terminal 31 of inductor device 28 and the terminal of potential source 10 opposite the terminal to which the anode of silicon controlled rectifier switching device 24 is connected through a circuit which may be traced from intermediate terminal 31, through line 37, silicon controlled rectifier device 36, capacitor 35, line 39, line 22 and input terminal 14.

As the anode electrode of silicon controlled rectifier device 36 is connected to the positive polarity terminal of potential source 10 through line 37, that portion of inductor 28 between intermediate terminal 31 and end terminal 29, line 26 and input terminal 12 and the cathode electrode thereof is connected to the opposite or negative polarity terminal of potential source 10 through capacitor 35, line 39, line 22 and input terminal 14, this device is forward poled and may be triggered to conduction upon the application of a potential pulse of a polarity which is positive in respect to the cathode to the control electrode 56 thereof.

The potential pulses which trigger silicon controlled rectifier devices 24 and 36 may be supplied from any suitable pulse source as determined by the application. Sources of the type which produce and direct potential pulses to selected lines or which direct pulses to selected lines are well known in the art. These pulses may be produced by transistor devices, electronic gate circuits, relays or manual switches. As the source of these pulses forms no part of this invention, it has been shown in block form and as referenced by numeral 52.

Initially, silicon controlled rectifiers 24 and 36 are nonconducting and capacitors 34 and 35 are discharged. When it is desired to establish an electrical circuit between the direct current potential source 10 and the electrical load 16, a triggering pulse of a positive polarity potential is applied to the control electrode 54 of silicon controlled rectifier switching device 24 through line 58 which triggers this device to conduction. With silicon controlled rectifier device 24 conducting, the electrical circuit between potential source 10 and electrical load 16 is established and capacitor 34 assumes a charge through lines 21 and 25.

When it is desired to interrupt this circuit, a triggering pulse of a positive polarity potential is applied to the control electrode 56 of silicon controlled rectifier 36 through line 59 which triggers this device to conduction. As silicon controlled rectifier 36 begins conducting, the potential at terminal 29 of inductor 28 remains positive, the potential at terminal 30 and the anode of silicon controlled rectifier 24 goes negative and the potential at junction 42 and the cathode of silicon controlled rectifier 24 remains positive because of discharging capacitor 34. These reverse polarity potentials are produced by this extinguishing circuitry and are applied across silicon controlled rectifier device 24. These potentials reverse the anode-cathode potential polarities of this device and extinguishes it rapidly. Capacitor 34 serves to momentarily support the positive potential at junction 42, applied to the cathode of silicon controlled rectifier 24, and also to support a brief negative surge of current through silicon controlled rectifier 24 which is required to extinguish it rapidly.

With the triggering of silicon controlled rectifier 36 to conduction and the extinguishing of silicon controlled rectifier 24, supply potential is removed from across inductor 28 and the potential thereacross begins to decrease toward zero, the potential across capacitor 35 begins to increase and the potential induced in inductor 28 by the resulting collapsing magnetic field tends to maintain current through inductor 28 which increases in a positive direction. The current in inductor 28 and the negative surge of current which extinguishes silicon controlled rectifier 24 combine and flow through conducting silicon controlled rectifier 36 to charge capacitor 35. Capacitor 46 provides a low impedance path around battery 10 for the charging current which charges capacitor 35 to a potential magnitude which approaches twice supply potential magnitude, depending upon the circuit parameters. This high charge upon capacitor 35 is applied across silicon controlled rectifier 36 as a reverse polarity potential, thereby rapidly extinguishing silicon controlled rectifier 36. To remove the charge on capacitor 35 to prepare the circuit to be operated again, a bleeder resistor 44 may be connected across capacitor 35 to line 22, as indicated.

The resistance, inductance and capacitance values of inductor 28, capacitors 35 and 46 and resistor 44 are selected to have a damping factor which is less than unity to provide the proper resonance in this circuit to insure that capacitor 35 reaches a charge of sufficient magnitude to rapidly extinguish silicon controlled rectifier 36.

It is to be understood that other methods of removing the charge from capacitor 35 such as returning the energy to the power supply or delivering it to the load may be employed without departing from the spirit of this invention.

An alternate embodiment of the electronic direct current switching circuit of this invention is set forth in FIGURE 2 wherein like elements have been given like characters of reference. This circuit differs from the embodiment of FIGURE 1 to the extent that the inductance element is a transformer, referenced at numeral 60, having a primary winding 61 and a secondary winding 62. The polarity relationships of these windings are as indicated. In a practical application of this circuit, it was found that a primary to secondary turns ratio of 20 to 10 satisfactorily operated this circuit.

The operation of this circuit is identical to that as described in regard to FIGURE 1 except that the extinguishing potentials are derived through the mutual coupling between windings 61 and 62 rather than by auto transformer action as with FIGURE 1.

As silicon controlled rectifier 36 is triggered to conduction, a heavy current flows therethrough charging capacitor 35. This heavy current flow also flows through secondary winding 62 of transformer 60 and produces a magnetic field which also links primary winding 61, inducing a potential therein. Secondary winding 62 and primary winding 61 are so poled relative to each other that this induced potential is of a positive polarity at terminal 29. This positive polarity potential, supported by the positive polarity potential from discharging capacitor 34, applied to the cathode of silicon controlled rectifier switching device 24 reverses the anode-cathode potential polarities of this device and extinguishes it rapidly.

This circuit offers certain advantages over that schematically set forth in FIGURE 1 from the standpoint of physical electrical connections in that the anodes of both of the silicon controlled rectifiers may be mounted on a common heat sink.

Both of these circuits offers distinct advantages over prior art arrangements of this type. During the turn off process, no extra energy is delivered to the load circuit. Only a very small inductor or transformer is required and these items are so designed that maximum current flow therethrough will not cause saturation, therefore, the circuit may be left on or off indefinitely which permits substantially 100% or zero power operation. Furthermore, this circuit is equally applicable with pulse width or pulse rate operation.

While a preferred embodiment of the present invention has been shown and described, it will be obvious to those skilled in the art that various modifications and substitutions may be made without departing from the spirit of the invention which is to be limited only within the scope of the appended claims.

What is claimed is as follows:

1. An electronic direct current switching circuit comprising in combination with a direct current potential source having positive and negative polarity terminals and an electrical load, a silicon controlled rectifier switching device having anode, cathode and control electrodes, an inductance element, means for connecting at least a portion of said inductance element and said anode and cathode electrodes of said silicon controlled rectifier switching device in series between said positive polarity terminal of said potential source and one side of said electrical load, a controllable switching device, means for connecting at least a portion of said inductance element and said controllable switching device in series across said potential source, a capacitor connected across said potential source between said silicon controlled rectifier switching device and said electrical load and means for connecting the other side of said electrical load to said negative polarity terminal of said potential source.

2. An electronic direct current switching circuit comprising in combination with a direct current potential source having positive and negative polarity terminals and an electrical load, a first silicon controlled rectifier switching device having anode, cathode and control electrodes, an inductance element, means for connecting at least a portion of said inductance element and said anode and cathode electrodes of said first silicon controlled rectifier switching device in series between said positive polarity terminal of said potential source and one side of said electrical load in that order, a first capacitor, a second silicon controlled rectifier device having anode, cathode and control electrodes, means for connecting at least a portion of said inductance element, said anode and cathode electrodes of said second silicon controlled rectifier device and said first capacitor in series across said positive and negative polarity terminals of said potential source in that order, a second capacitor connected between said cathode electrode of said first silicon controlled rectifier switching device and said negative polarity terminal of said potential source and means for connecting the other side of said electrical load to said negative polarity terminal of said potential source.

3. An electronic direct current switching circuit comprising in combination with a direct current potential source having positive and negative polarity terminals and an electrical load, a first silicon controller rectifier switching device having anode, cathode and control electrodes, an inductor device having two end terminals and an intermediate terminal, means for connecting said end terminals of said inductor device in series with said anode and cathode electrodes of said first silicon controlled rectifier switching device between said positive polarity terminal of said potential source and one side of said load in that order, a first capacitor connected between said cathode electrode of said first silicon controlled rectifier switching device and said negative polarity terminal of said potential source, a second silicon controlled rectifier device having anode, cathode and control electrodes, a second capacitor, means for connecting said anode and cathode electrodes of said second silicon controlled rectifier device and said second capacitor in series between said intermediate terminal of said inductor device and said negative polarity terminal of said potential source and means for connecting the other side of said load to said negative polarity terminal of said potential source.

4. An electronic direct current switching circuit comprising in combination with a direct current potential source having positive and negative polarity terminals and an electrical load, a first silicon controlled rectifier switching device having anode, cathode and control electrodes, an inductance having a first winding and a second winding, means for connecting said anode and cathode electrodes of said first silicon controlled rectifier switching device and a selected one of said windings of said inductance element in series between a selected one polarity terminal of said potential source and one side of said electrical load, a first capacitor connected between said cathode electrode of said first silicon controlled rectifier switching device and the other polarity terminal of said potential source, a second silicon controlled rectifier device having anode, cathode and control electrodes, a second capacitor, means for connecting said anode and cathode electrodes of said second silicon controlled rectifier device, said other winding of said inductance element and said second capacitor in series across said potential source and means for connecting the other side of said electrical load to the other polarity terminal of said potential source.

5. An electronic direct current switching circuit comprising in combination with a direct current potential source having positive and negative polarity terminals and an electrical load, a first silicon controlled rectifier switching device having anode, cathode and control electrodes, an inductance element having a first winding and a second winding, means for connecting said anode and cathode electrodes of said first silicon controlled rectifier switching device and said first winding of said inductance element in series between said positive polarity terminal of said potential source and one side of said electrical load in that order a first capacitor connected between said cathode electrode of said first silicon controlled rectifier switching device and said negative polarity terminal of said potential source, a second silicon controlled rectifier switching device having anode, cathode and control electrodes, a second capacitor, means for connecting said anode and cathode electrodes of said second silicon controlled rectifier device, said second winding of said inductance element and said second capacitor in series across said potential source and means for connecting the other side of said electrical load to said negative polarity terminal of said potential source.

References Cited

UNITED STATES PATENTS

| | | | |
|---|---|---|---|
| 3,317,816 | 5/1967 | Wilting | 307—284 X |
| 3,331,014 | 7/1967 | Greenberg et al. | 307—252 X |

OTHER REFERENCES

G.E. Notes on the Application of the Silicon Controlled Rectifier, ECG-371-1, December 1958, pp. 36-39.

ARTHUR GAUSS, *Primary Examiner.*

DONALD D. FORRER, *Assistant Examiner.*

U.S. Cl. X.R.

307—305